US005359260A

United States Patent [19]

Rawlings et al.

[11] Patent Number: 5,359,260

[45] Date of Patent: Oct. 25, 1994

[54] DISPLAYS

[75] Inventors: Keith C. Rawlings, Cheltenham; Neil A. Fox, Eversham, both of England

[73] Assignee: Smiths Industries Public Limited Company, London, England

[21] Appl. No.: 802,406

[22] Filed: Dec. 4, 1991

[30] Foreign Application Priority Data

Dec. 20, 1990 [GB] United Kingdom ................ 9027618

[51] Int. Cl.[5] ...................... H05B 33/14; H01L 33/00

[52] U.S. Cl. ....................................... 313/498; 257/88; 313/505; 313/509

[58] Field of Search ............... 313/498, 500, 505, 509, 313/309, 422; 257/83, 88, 89

[56] References Cited

U.S. PATENT DOCUMENTS

| | | | |
|---|---|---|---|
| 3,015,747 | 1/1962 | Rosenberg | 313/505 X |
| 3,042,834 | 7/1962 | Nicoll | 313/505 X |
| 3,512,041 | 5/1970 | Dalmasso | 257/88 |
| 4,015,166 | 3/1977 | Ohshima et al. | 313/509 X |
| 4,081,716 | 3/1978 | Uemura | 313/63 |
| 4,857,161 | 8/1989 | Borel et al. | 313/309 X |
| 4,857,799 | 8/1989 | Spindt et al. | 313/309 X |

FOREIGN PATENT DOCUMENTS

| | | |
|---|---|---|
| 933287 | 9/1973 | Canada . |
| 0420167 | 4/1991 | European Pat. Off. . |
| 2708654 | 9/1977 | Fed. Rep. of Germany . |
| 2083868 | 12/1971 | France . |
| 2135117 | 8/1984 | United Kingdom . |

*Primary Examiner*—Sandra L. O'Shea

*Attorney, Agent, or Firm*—Pollock, VandeSande and Priddy

[57] ABSTRACT

A solid-state display comprises a glass plate on which is deposited an upper layer of parallel conductive tracks interrupted by recesses containing regions of conductive or semiconductive phosphor. An array of ballistic transistors within a semiconductor layer is in alignment on one side with the phosphor regions and on the other side with lower conductive tracks which extend at right angles to the tracks in the upper layer. When a voltage is applied to one of the tracks in the upper layer which is positive with respect to the voltage applied to one of the lower tracks it causes one of the transistors to emit electrons upwardly into the adjacent phosphor region. This causes fluorescence of the region and the emission of light through the glass plate.

6 Claims, 2 Drawing Sheets

DISPLAYS

BACKGROUND OF THE INVENTION

This invention relates to displays.

Currently available displays take various different forms. In cathode-ray tube displays (CRT's) electrons produced by a source are accelerated by an applied voltage across a vacuum onto a phosphor screen. The beam of electrodes is scanned over the screen magnetically or electrostatically, to produce the desired display representation. CRT's suffer from various disadvantages. They require high drive voltages, they are relatively bulky and are not very robust.

Alternative displays generally comprise a matrix array of light-emitting or reflecting devices, such as light-emitting diodes or liquid crystal elements. These can provide more compact and robust displays than CRT's but also suffer from various disadvantages such as relatively slow response times, lower resolution, reduced visibility or limited viewing angle.

SUMMARY OF THE INVENTION

It is an object of the present invention to provide an improved form of display.

According to the present invention there is provided a display including a first layer containing a fluorescent material, an array of electron-emitting active components being mounted in contact with the layer arranged such that energization of a component causes electrons to be emitted into the layer of fluorescent material to excite the layer adjacent the component to produce optical radiation.

The first layer may include an array of discrete regions of fluorescent material aligned with the active components. Different ones of the discrete regions may be of different fluorescent material such that optical radiation emitted from the different regions are of different colors. Each discrete region of fluorescent material may be aligned with a plurality of adjacent active components which emit electrons into the same region. The first layer may be a layer of electrically-conductive material and preferably comprises a plurality of parallel electrically-conductive tracks, each track having at a plurality of locations along its length a discrete region of the fluorescent material, and each region of fluorescent material being aligned with respective electron-emitting active components. The display preferably includes a lower layer of electrically-conductive tracks insulated from the first layer, the tracks in the lower layer extending at right angles to the tracks in the first layer and being electrically connected to the electron-emitting active components such that individual ones of the active components can be caused to emit electrons by applying a voltage between appropriate ones of the tracks in the first and lower layers. The display preferably includes an intermediate layer of semiconductive material, the active components being formed within the intermediate layer. The cross-sectional area of the active components may be larger adjacent the first layer than remote from the first layer. The active components may be field-effect transistors such as ballistic transistors. The fluorescent material is preferably a phosphor and may include an electrically-conductive or semiconductive material.

BRIEF DESCRIPTION OF THE DRAWINGS

A display according to the present invention, will now be described, by way of example, with referenece to the accompanying drawing, in which.

DESCRIPTION OF THE PREFERRED EMBODIMENT

Figure 1:
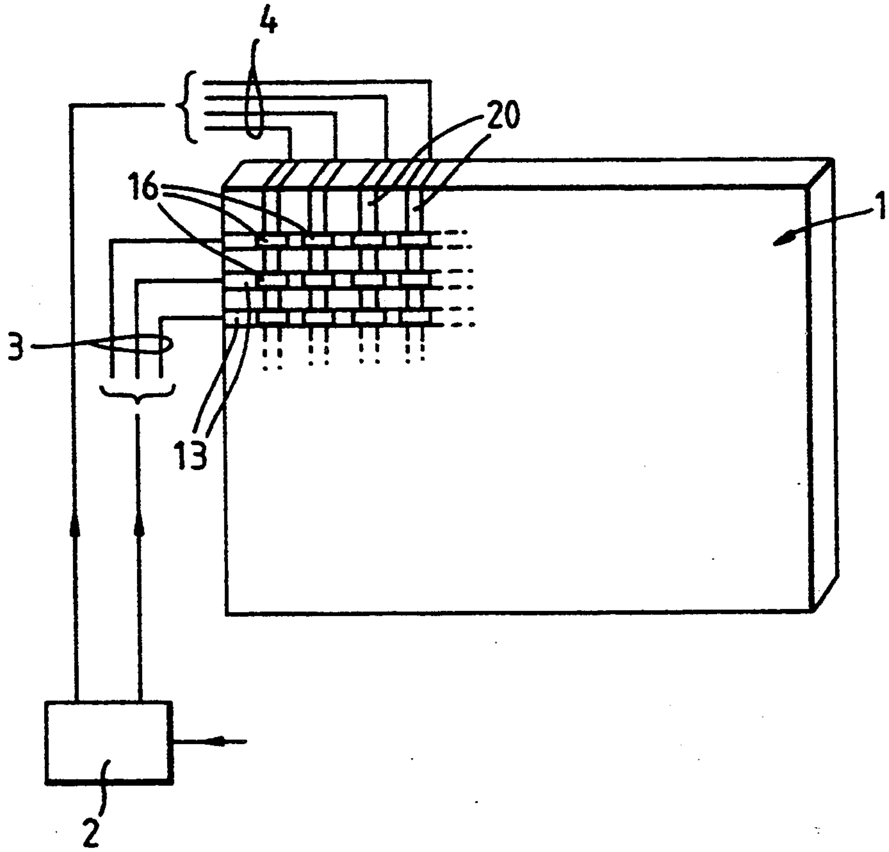
FIG. 1 is a perspective view of the display.
Figure 2:
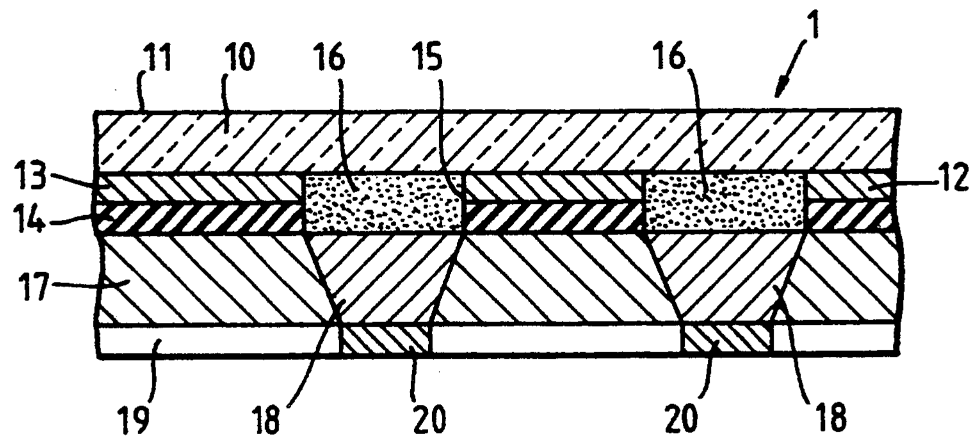
FIG. 2 is a sectional view of a part of the display to an enlarged scale.

The display is in the form of a multi-layer flat panel 1 connected to a driver circuit 2 via conductors 3 and 4. The panel 1 comprises an upper layer 10, facing the viewer of the display, which is a plate of an optically-transparent material such as glass. The layer 10 may be tinted to improve visibility or to modify the color of the display as desired. An anti-reflection coating (not shown) may be formed on the upper surface 11 of the glass. On the lower surface of the glass sheet 10 there is deposited a first, upper electrically-conductive electrode layer 12, which takes the form of closely-spaced parallel metal tracks 13 extending across the width of the panel 1 between opposite edges. At one edge, the metal tracks 13 are connected to respective ones of the conductors 3. The metal tracks 13 are insulated on their lower surface by an insulating layer 14.

At regular intervals along their length, apertures 15 are formed through the metal tracks 13 and the insulating layer 14. The size of the apertures 15 is slightly less than the width of each track so that the tracks conduct along their entire length. A fluorescent material 16, such as a phosphor, is deposited in the apertures to form discrete phosphor regions within the layer 12. The apertures 15 may be of rectangular, square, circular, hexagonal or other shape, the phosphor regions 16 appearing, when viewed from above, as a closely-packed orthogonal array of dots or short stripes.

The glass sheet 10 may be configured with recesses or other surface formation (not shown), aligned with the phosphor regions, to improve light transmission or the appearance of the display.

Below the insulating layer 14 is deposited an intermediate layer 17 of a semiconductor material such as silicon. The semiconductor layer 17 is interrupted by an array of field effect or ballistic transistors 18, or other active components capable of generating high energy electrons. Ballistic transistors are a variant of field effect transistors and their construction is well known, such as described in "Comparison of vacuum and semiconductor field effect transistor performance limits", Lester F. Eastman, Vacuum Microelectronics 89, R. E. Turner (ed), Institute of Physics, 1989, pp 189–194. The transistors consist of multiple layers and may be silicon or, preferably, gallium arsenide. The transistors 18 are arranged in rows and columns in alignment and contact with the phosphor regions 16.

On the lower surface of the panel 1 there is formed a second, lower electrically-conductive layer 19 in the form of closely-spaced parallel metal tracks 20. The lower tracks 20 lie at right angles to the upper tracks 13 and extend across the height of the panel 1 between opposite edges, being aligned with different ones of the transistors 18 along each row. At one edge, the tracks 20 are connected to respective ones of the conductors 4.

The drive circuit 2 may be of any conventional form used to drive conventional matrix array displays, such as employing various multiplexing techniques. Alternatively, distributed processors could be used, such as described in GB 2206270A.

A display representation is provided by applying a suitable voltage across appropriate ones of the ballistic transistors 18. Any individual one of the ballistic transistors 18 can be energized by applying voltage between one of the conductors 3, to select the desired row or track 13, and one of the conductors 4, to select the desired column or track 20. The voltage applied to the conductors 3, and hence the upper electrode layer 12, is more positive than that applied to the conductors 4, and hence the lower electrode layer 19.

When the desired transistor 18 is addressed it is caused to emit high energy electrons which flow upwardly towards the upper electrode layer 12. A proportion of the electrons produced flow into the phosphor regions 16 with a sufficiently high energy to cause fluorescence and the emission of optical radiation. The optical radiation emitted by the phosphor region 16 appears as a bright spot. By varying the voltage applied across the ballistic transistors 18, the electron energy can be varied and hence the apparent brightness of the phosphor region 16. Each transistor 18 is preferably tapered through the depth of the semiconductor layer 17, so that its cross-sectional area in the plane of the semiconductor layer is larger adjacent the phosphor material 16 and the first layer 12 than remote from the first layer 12, adjacent the other electrode layer 19. In this way, the spacing between adjacent phosphor regions 16 can be kept to a minimum for a given spacing between the ballistic transistors 18. It may be necessary to use several transistors for each pixel in order to increase the brightness of the display. In such an arrangement adjacent ones of the transistors would be aligned with a common one of the discrete phosphor regions so that the electrons emitted by the transistors flow into the same phosphor region.

The display has the advantage that it is solid-state without any vacuum chamber and therefore can be rugged and compact. The ballistic transistors 18 are fast acting compared with, for example, liquid crystal elements, so that the display is particularly suited for representing rapidly changing images. The viewing angle of the display can be the same as for CRT's. The different layers of the panel 1 can be deposited by conventional screen printing and photolithographic processes well known in the manufacture of integrated circuits.

Although the display described above only provides a monochrome image, color images can readily be produced, either by using three different phosphors that emit radiation in the red, green and blue parts of the spectrum, or by applying red, green and blue filters between the upper surface of the phosphor regions 16 and the glass sheet 10.

The phosphor may include a material to render it electrically conductive or semiconductive so that the voltage applied between the tracks 13 and 20 causes a direct flow of electrons into the phosphor region.

Figure 3:
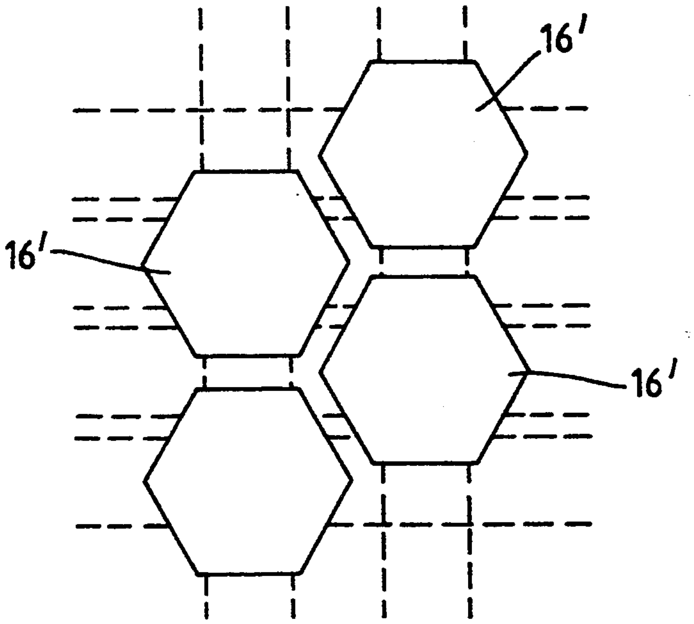
FIG. 3 shows a modification of the display.

Different arrays of the phosphor regions and ballistic transistors are possible, such as that shown in FIG. 3 where the phosphor regions 16' are of hexagonal shape and arranged in a cubic close packed configuration.

Alternatively, where the display is only required to be used for representing one symbol or legend, or a limited number of them, the phosphor regions need only be located in regions coinciding with that symbol or legend. A more simplified drive circuit could be used for such an arrangement.

What we claim is:

1. A display comprising a substrate that includes a first layer containing a fluorescent material and a second layer of semiconductor material, an array of electron-emitting active components formed within said second layer and in contact with said first layer, and first and second pluralities of electrodes for energizing selected ones of said active components, said first and second pluralities of electrodes being located respectively in two different planes that are spaced from one another in said substrate, energization of a selected component causing electrons to be generated by the component and emitted from the component directly into said layer of fluorescent material so that the electrons generated by each energized component excite a portion of said first layer adjacent the energized component to produce optical radiation.

2. A display according to claim 1, wherein the active components are field effect transistors.

3. A display according to claim 1, wherein the active components are ballistic transistors.

4. A display according to claim 1, wherein the fluorescent material is a phosphor including an electrically-conductive or semiconductive material.

5. A display comprising a substrate that includes a horizontal layer containing a fluorescent material, an array of electron-emitting active components located below and in contact with said horizontal layer, the cross-sectional area of said active components being larger adjacent said horizontal layer than remote from the horizontal layer, a plurality of electrodes for energizing selected ones of said active components, said electrodes being located in two different planes that are spaced one above the other in said substrate, energization of a selected component causing electrons to be generated by the component and emitted vertically upwards from the component directly into said horizontal layer of fluorescent material so that the electrons generated by each energized component excite a portion of said horizontal layer adjacent the energized component to produce optical radiation.

6. A display comprising: a transparent plate having an upper surface and a lower surface; a first layer on the lower surface of the plate, said first layer comprising a plurality of elongated electrically-conductive tracks each of which has at a plurality of locations along its length a discrete region of fluorescent material; a second layer consisting of electrically-insulative material on a lower surface of said conductive tracks below and remote from said transparent plate, a lower surface of said discrete regions of fluorescent material being exposed through said second layer; a third layer consisting of semiconductive material on a lower surface of said second layer of insulative material below and remote from said conductive tracks, said semiconductive layer including within it an array of electron-emitting active components located below and respectively aligned with and in contact with the lower surfaces of respective regions of said fluorescent material; and a fourth layer consisting of further electrically-conductive tracks below and in electrical contact with said active components such that, when a positive voltage is applied to a track in said first layer with respect to a track in said fourth layer, the voltage is applied across at least one of said electron-emitting active components causing it to emit electrons vertically upwards directly into the discrete region of fluorescent material which it contacts such that said regions are excited by the electrons generated by the respective active components to produce optical radiation which passes through the transparent plate.

* * * * *